United States Patent
Watelmacher

(10) Patent No.: US 9,425,338 B2
(45) Date of Patent: Aug. 23, 2016

(54) SOLAR SYSTEM FOR GENERATING ELECTRIC POWER

(75) Inventor: Boris Watelmacher, Ganie Tikva (IL)

(73) Assignee: SOLARWAT LTD, Even Yehuda (IL)

( * ) Notice: Subject to any disclaimer, the term of this patent is extended or adjusted under 35 U.S.C. 154(b) by 736 days.

(21) Appl. No.: 13/520,192

(22) PCT Filed: Jan. 23, 2011

(86) PCT No.: PCT/IL2011/000073
§ 371 (c)(1),
(2), (4) Date: Jul. 2, 2012

(87) PCT Pub. No.: WO2011/089607
PCT Pub. Date: Jul. 28, 2011

(65) Prior Publication Data
US 2012/0313440 A1    Dec. 13, 2012

Related U.S. Application Data

(60) Provisional application No. 61/297,747, filed on Jan. 23, 2010.

(51) Int. Cl.
*H02J 1/00*    (2006.01)
*H01L 31/05*    (2014.01)
(Continued)

(52) U.S. Cl.
CPC ............ *H01L 31/0504* (2013.01); *H02S 40/30* (2014.12); *H02J 3/383* (2013.01); *Y02E 10/563* (2013.01); *Y10T 307/685* (2015.04); *Y10T 307/696* (2015.04)

(58) Field of Classification Search
CPC .................. H01F 207/2819; H01L 31/02021; H01L 31/0504
See application file for complete search history.

(56) References Cited

U.S. PATENT DOCUMENTS

| 4,483,319 A | 11/1984 | Dinh |
| 7,102,251 B2 | 9/2006 | West |

(Continued)

FOREIGN PATENT DOCUMENTS

| DE | 10136147 | 2/2003 |
| JP | S5382192 | 7/1978 |

(Continued)

OTHER PUBLICATIONS

ISR for related PCTIL20110000732573 mailed on Jun. 21, 2011.
(Continued)

*Primary Examiner* — Daniel Cavallari
(74) *Attorney, Agent, or Firm* — Graeser Associates International Inc; Dvorah Graeser

(57) ABSTRACT

A solar power generation system for providing operating power for a desired application, the system includes one or more solar-array modules, wherein each of the one or more solar-array modules includes a multiplicity of solar cells and a high efficiency DC to DC power converter. The multiplicity of solar cells is arranged in strings of serial-units electrically connected in parallel to form a crisscross matrix array of solar cells, which matrix allows currents to bypass malfunctioning cells, thereby improving the performance of the system. The power converter includes fast MOSFET transistors having duty cycle that is operationally constant and is almost 50%. Optionally, the power converter includes a plus conductive pad and a minus conductive pad, wherein each of the strings of serial-units is individually wired to the plus conductive pad and the minus conductive pad.

22 Claims, 17 Drawing Sheets

(51) Int. Cl.
*H02S 40/30* (2014.01)
*H02J 3/38* (2006.01)

(56) References Cited

U.S. PATENT DOCUMENTS

| | | | |
|---|---|---|---|
| 2002/0159214 | A1 | 10/2002 | Perlick et al. |
| 2005/0061361 | A1* | 3/2005 | Ochi et al. .................... 136/252 |
| 2008/0099062 | A1* | 5/2008 | Armstrong et al. ............ 136/248 |
| 2008/0179949 | A1* | 7/2008 | Besser et al. .................... 307/24 |
| 2009/0183760 | A1 | 7/2009 | Meyer |
| 2010/0186795 | A1* | 7/2010 | Gaul .............................. 136/244 |
| 2012/0042588 | A1* | 2/2012 | Erickson, Jr. ..... H01L 31/02021 52/173.3 |

FOREIGN PATENT DOCUMENTS

| | | |
|---|---|---|
| JP | 2000166124 | 6/2000 |
| JP | 2003092418 | 3/2003 |
| JP | 2005115441 | 4/2005 |
| JP | 2005312158 | 11/2005 |

OTHER PUBLICATIONS

Hwu K I et al: "Digital control of 1-15 isolated two-stage DC-DC converter with synchronization considered". Industrial Electronics. 2009. ISIE 2009. IEEE International Symposium on. IEEE. Piscataway. NJ. USA. Jul. 5, 2009. pp. 1598-1603.

Liu B et al: "A DC-Module-Based 6-9 Power Configuration for Residential Photovoltaic Power Application". Power Electronics and Drive Systems. 2007. PEDS '07. 7th International Conference on. IEEE. Piscataway. NJ. USA. Nov. 27, 2007. pp. 631-636.

Gautam N Ketal: "Reliability evaluation of solar photovoltaic arrays". Solar Energy. Pergamon Press. Oxford. GB. vol. 72. No. 2. Feb. 1, 2002. pp. 129-141.

Yu, B. "Analysis and Experiment of Cross-tied Configuration of Partial Shaded PV Array". 23rd European Photovoltaic Solar Energy Conference. EU PVSEC Valencia. Spain. Sep. 1, 2008. pp. 3192-3194.

Yu-Kun Tai et al: "Realization of the maximum utilization effectiveness of semiconductor devices and magnetic components for push-pull converters". Industrial Electronics and Applications. 2008. ICIEA 2008. 3rd IEEE Conference on. IEEE. Piscataway. NJ. USA. Jun. 3, 2008. pp. 1517-1521.

JP2005312158—Translated abstract.
JPS5382192—Translated abstract.
ESR for related EP11734453 mailed on Oct. 13, 2014.
JP2000166124—Translation retrieved on Dec. 14, 2014 (www.espacenet.com).
JP2003092418—Translation retrieved on Dec. 14, 2014 (www.espacenet.com).
JP2005115441—Translation retrieved on Dec. 14, 2014 (www.espacenet.com).
Office Action for related JP2012549465 mailed on Sep. 16, 2014 translation.
Office Action for related CN201190000272 mailed on Nov. 29, 2012 translation.

* cited by examiner

SOLAR SYSTEM FOR GENERATING ELECTRIC POWER

CROSS-REFERENCE TO RELATED APPLICATIONS

This Application is a national phase of, and claims priority from, PCT Application No. PCT/IL2011/000073, filed on Jan. 23 2011, which claims priority from U.S. Provisional Application No. 61/297,747, filed on Jan. 23 2010, both of which are hereby incorporated by reference as if fully set forth herein.

FIELD OF THE INVENTION

The present invention relates to a solar electric-power generation apparatus and more particularly, to a solar electric-power generation apparatus facilitated to maximize the power generation of a solar array, having a crisscross network configuration, wherein the solar cells are often subject to at least partial shading.

BACKGROUND OF THE INVENTION

Photovoltaic cells have been widely used in a variety of applications to generate convenient electricity. Typically, a single solar cell produces an output voltage around 0.5V, and a plurality of cells, typically Silicon based, is conventionally connected in series to provide higher voltage levels. Referring to FIG. 1a, multiple solar cell 22 are conventionally connected in series to form a "serial-unit" 26 of solar cells 22, wherein multiple serial-units 26 may be interconnected in series to form a string of serial-units 28, in order to obtain the desired output voltage in a solar-array module 20. Each serial-unit 26 may include one or more cells and is protected by a bypass diode 25 that is added to bypass local problems such as dirt, overcastting shades, other partial shading or otherwise malfunctioning cells.

Solar cells 22, being connected in series, suffer from the following setbacks:
a) Solar cells 22 may be subject to at least a partial light occlusion due to shading and/or dirt accumulated on one or more modules. Electric power generated in partially shaded cells is greatly reduced. An electric current produced by the cell is reduced proportional to the light intensity decreasing. Bypass diodes 25 enable the flow of electric current but does not compensate for the lost power from the bypassed serial-unit 26. Typically, the voltage drop on a diode 25 is about 0.25V.
b) Typically, solar array module 20 is sensitive to inverse breakdown voltage that may be developed in another solar-array module 20. Diode 27 prevents the breakage of the solar-array module. Diode 27 also prevents a solar-array module output short circuit.
c) Inequality between solar cells 22 also yields a loss in power.

In an exemplary arrangement, for a nominal 30 volt Silicon solar-array module generating system, about 60 cells are connected in series to produce a 30 volt output. Usually, bypass diodes are placed across groups of cells, for example, 5-20 cells per diode instead of one bypass diode per cell to lower the cost. Cells connected in series with bypass diodes have been proven to be effective in many photovoltaic applications.

Reference is also made to FIG. 1b, which is a schematic block diagram showing the voltage drop on output protection series diodes of a conventional solar module 20. Furthermore:

$$V_{out} = V_p - V_{ds} [V] \qquad (2)$$

where Vout is the total voltage produced by the module including voltage drop on series diode 27. This voltage drop may be the reason for module additional power losses.

Practically, two diodes electrically connected in series are used in order to avoid diode breakdown voltage. If a cell in a serial-unit 26 malfunctions for any reason, the power produced by the whole serial-unit 26 is lost. The power produced by the module is computed as follows:

$$Pout = Pp\left(1 - \frac{xn}{m} - \frac{2*Vds + n*Vdp}{\frac{Vp*(m-xn)}{m}}\right) \quad [W] \qquad (1)$$

where
Pout is the total power produced by the module, including power loss on series diodes 27.
Pp is the maximum power that solar-array module 20 produces when all cells 22 12 function,
x is the number of cells 22 in a serial-unit 26,
n is the number of malfunctioning serial-units 26,
Vds is the voltage drop over a diode 27 electrically connected in series with solar-array module 20,
Vdp is the voltage drop over bypass diode 25 electrically connected in parallel with a serial-unit 26, and
Vp is the voltage that solar-array module 20 produces when all cells 22 function.

It should be noted that equation (1) is an approximation and is suitable for $x*n \leq 45$.

Reference is now made to FIG. 2—a block diagram, showing a prior art solar-array module 30. Solar-array module 30 includes solar cells 22 electrically connected in series to form serial-units 26. In the example shown in FIG. 2, each serial-unit 26 includes 4 solar cells 22. The serial-units 26 are interconnected in parallel (32), to obtain a desired current producing capacity for solar array module 30. The number of solar cells 22 that form a serial-unit 26 determines the voltage level provided by solar-array module 30. The number of serial-units 26, electrically connected in parallel, determines the current level provided by solar-array module 30, to thereby obtain the predetermined electric power.

For example, a solar module 30 includes 60 solar cells 22, wherein each serial-unit 26 includes 4 solar cells 22 and wherein 15 serial-units 26 are electrically interconnected in parallel. For solar cells 22 that produce 0.5 Volt each, each serial-unit 26 produces 2 Volts.

A power converter 34 is connected at the exit of the array of solar cells 22 of module 30, which power converter 34 converts the input voltage level (2 Volts, in the afore mentioned example) to a significantly higher output voltage level, for example 30 Volts, in the afore mentioned example. Hence, when a solar cell 22 that is a member of a serial-unit 26 is defective, the module loses the power of the whole serial-unit 26.

Therefore, there is a need and it would be advantageous be able to prevent power loses of the whole serial-unit 26 as a result of a malfunction solar cell.

Reference is also made to FIG. 3—a block diagram, showing a prior art solar-array module 40. Solar-array module 40 is similar to solar array module 30, except that each serial-unit 26 includes a single solar cell 22. Solar module 40 is optimal in the sense that when a solar cell 22 malfunctions, the only power loss is the power of the serial-unit 26 containing the malfunctioning solar cell 22.

In an optimal solar module the power loses are very small.

Typically, the voltage level of a conventional solar cell 22 is relatively low (about 0.5V). With this level of input voltage, the input current of power converter 44 for solar module, for example of 250 W, will be very high (more than 500 A), and power converter 44 efficiency is not high enough to provide such current level. Therefor, there is a need and it would be advantageous be able to provide a higher input voltage to power converter 44.

It should be noted that throughout the present disclosure, the invention is described using the text and related drawings. The equations are included only as a possible help to persons skilled in the art, and should not be considered as limiting the invention in any way. Various other equations may be used by persons skilled in the art.

There is a need for and it would be advantageous to have an apparatus, system and method for solar electric power generation, wherein the apparatus facilitates maximization of the power generated by a solar-array module in which module one or more Silicon solar cells malfunction.

SUMMARY OF THE INVENTION

By way of introduction, the principal intentions of the present invention include providing a solar-array system that includes one or more solar-array modules. Each solar-array module includes multiple solar cells. Groups of solar cells are electrically connected in series to form a serial-unit of cells. Multiple serial-units of cells are electrically connected in parallel to form an array of cells, wherein all solar cells are electrically interconnected to form a crisscross network of solar cells. That is, multiple serial-units may be further electrically interconnected in series to form a string of serial-units, wherein the strings of serial-units are also electrically interconnected in parallel, to form a crisscross matrix array of solar cells.

The present invention includes providing a solar-array module, wherein all the solar cells are electrically interconnected in a crisscross configuration, to form a network of solar cells. Each solar-array module includes a power converter, which power converter is electrically connected at the exit of the array of solar cells, and which power converter is required to convert the input voltage level to a significantly higher output voltage level at the panel output.

The power converter is facilitated of handling large values of input current. Such currents are required to supply a significant power at low voltage. For example, in a 250 Watt power converter with an input voltage of 2 Volt and an efficiency of 95%, the required input current is 132 Amp.

If some of the light is prevented from illuminating a particular solar cell, the total power of the solar-array module will be reduced by the defective cell. All the remaining cells in the string of serial-unit will continue to provide the produced power to the solar-array module. The total solar-array module power can be calculated by the follows formula, which formula generalizes formula (3):

$$Pout = Pmax(1 - xn/m)\eta \, [W] \quad (4)$$

where
Pout is the total power produced by the solar-array module when one or more solar cells malfunction,
Pmax is the maximum power that the solar-array module produces when all solar cells function,
x is the number of solar cells in a serial-unit,
n is the number of malfunctioning serial-units,
m is the number of solar cells in the solar-array module,
$\eta$ is the power converter's efficiency.

According to the teachings of the present invention, there is provided a solar power generation system for providing operating power for a desired application, the desired application having a predetermined operating power level requirement and predetermined operating voltage level requirement. The system includes one or more solar-array modules, wherein each of the one or more solar-array modules includes a multiplicity of solar cells and a high efficiency DC to DC power converter.

A preconfigured number of the solar cells are electrically connected in series to form a string of serial-units, which string of serial-units is facilitated to produce a first output voltage level, wherein the first output voltage level is insufficient to meet the desired application operating voltage level requirement. Also, a preconfigured number of the strings of serial-units are electrically connected in parallel to form an array of the solar cells, which array of the solar cells is facilitated to produce a first output power level.

In each of the strings of serial-units, at least one selected solar cell of one of the strings of serial-units is also electrically connected in parallel to the respective solar cell of all other strings of serial-units, to form a crisscross matrix array of solar cells, wherein the crisscross matrix array of solar cells allows currents to bypass malfunctioning cells, thereby improving the performance of the system.

The high efficiency DC to DC power converter is electrically connected to the crisscross matrix array of solar cells, the power converter configured to boost the first output voltage level to a second output voltage level higher than the first output voltage level. Preferably, the second output voltage level is substantially sufficient to meet the desired application operating voltage level requirement.

Preferably, in each of the strings of serial-units, each solar cell is also electrically connected in parallel to the respective solar cell of all other strings of serial-units, to form the crisscross matrix array of solar cells.

Preferably, each of the strings of serial-units consists of the same number of the solar cells electrically connected in series.

Preferably, the power converter includes fast MOSFET transistors for alternately connecting the opposite sides in a primary of a transformer to a DC source, wherein the duty cycle of the fast MOSFET transistors is operationally constant and is almost 50%.

Optionally, a preconfigured number of solar-array modules are electrically connected in series to form a string of solar-array modules, wherein the array of solar-array modules produces a third output voltage level, and wherein the third output voltage level is substantially sufficient to meet the desired application operating voltage level requirement. Optionally, a preconfigured number of the strings of solar-array modules are electrically connected in parallel, to form an array of solar-array modules, wherein the array of solar-array modules produces a third output power level, and wherein the third output power level is substantially sufficient to meet the desired application operating power level requirement.

Optionally, the power converter includes a planar transformer, which transformer includes a ferromagnetic core, wherein two window openings are formed at the opposing ends of the ferromagnetic core, a primary coil, a secondary coil, input coil leads and output coil leads. The optional power converter further includes, an input printed circuit board, wherein receiving holes are formed in the input printed circuit, facilitating direct electrical connection to the input coil leads, and an output printed circuit board, wherein receiving holes are formed in the output printed circuit board, facilitating direct electrical connection to the output coil leads. The input printed circuit board and output printed circuit board are respectively disposed at the window openings of the ferromagnetic core, to thereby minimize the wiring length of wires from the primary coil and the secondary coil to the input printed circuit board and output printed circuit board, respectively.

Optionally, the power converter includes a plus conductive pad and a minus conductive pad, wherein each of the strings of serial-units is individually wired to the plus conductive pad and the minus conductive pad.

Optionally, each of the solar-array modules further includes a secondary, low power array of solar cells, used to start up the DC to DC power converter.

Optionally, the solar power generation system of the present invention includes one or more solar-array modules, wherein each of the one or more solar-array modules includes a multiplicity of solar cells, a high efficiency DC to DC power converter and a start up device. A preconfigured number of the solar cells are electrically connected in series to form a string of serial-units, which string of serial-units is facilitated to produce a first output voltage level, wherein the first output voltage level is insufficient to meet the desired application operating voltage level requirement. Also, a preconfigured number of the strings of serial-units are electrically connected in parallel to form an array of the solar cells, which array of the solar cells is facilitated to produce a first output power level.

Furthermore, in the optional solar power generation system, a preconfigured number of the solar cells are electrically connected in series to form a string of serial-units, the string of serial-units is facilitated to produce a first output voltage level; and a preconfigured number of the strings of serial-units are electrically connected in parallel to form an array of the solar cells, the array of the solar cells is facilitated to produce a first output power level. Furthermore, in the optional solar power generation system, a high efficiency DC to DC power converter electrically connected to the array of solar cells, the power converter configured to boost the first output voltage level to a second output voltage level higher than the first output voltage level, wherein the first output voltage level is insufficient to meet the desired application operating voltage level requirement, and wherein each of the solar-array modules includes a secondary, low power array of solar cells, used to start up the DC to DC power converter.

These and further embodiments will be apparent from the detailed description and examples that follow.

BRIEF DESCRIPTION OF THE DRAWINGS

The present invention will become fully understood from the detailed description given herein below and the accompanying drawings, which are given by way of illustration and example only, and thus not limiting in any way, wherein.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided, so that this disclosure will be thorough and complete, and will fully convey the scope of the present invention to those skilled in the art.

Unless otherwise defined, all technical and scientific terms used herein have the same meaning as commonly understood by one of ordinary skill in the art to which the present invention belongs. The methods and examples provided herein are illustrative only, and not intended to be limiting.

By way of introduction, the principal intentions of the present invention include providing solar electric power generation apparatus and system that facilitates maximization of the power generated by a solar array module apparatus having one or more malfunctioning Silicon solar cells.

Figure 4:
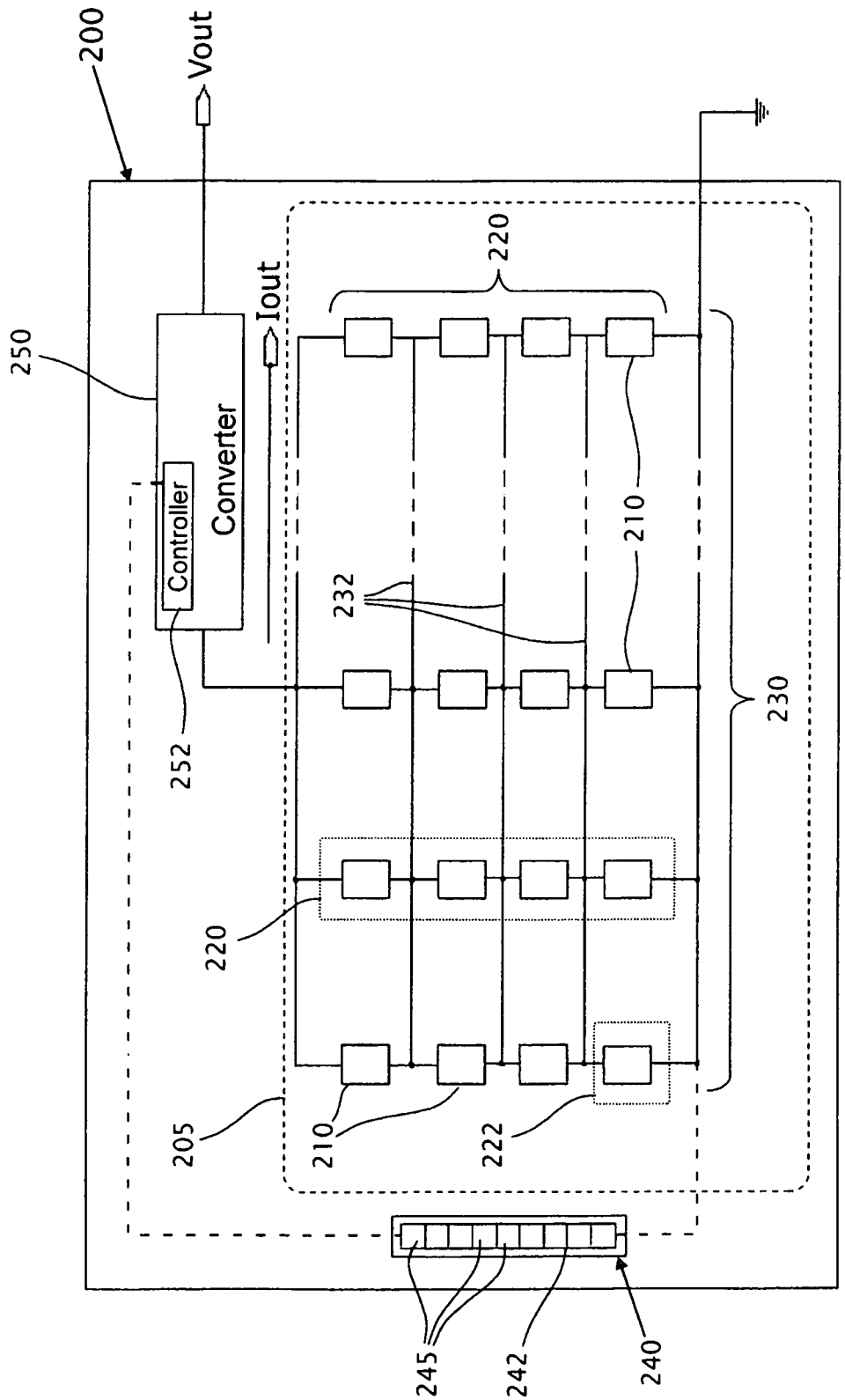
FIG. 4 is a schematic block diagram showing a solar-array module, wherein the cells are electrically interconnected in a crisscross matrix configuration, according to embodiments of the present invention, to allow currents to bypass malfunctioning solar cells.

Reference is now made to FIG. 4, which is a schematic block diagram showing a solar-array module 200, wherein all solar cells are electrically interconnected in a crisscross matrix configuration, according to variations of the present invention, to allow currents to bypass malfunctioning solar cells.

Figure 3:
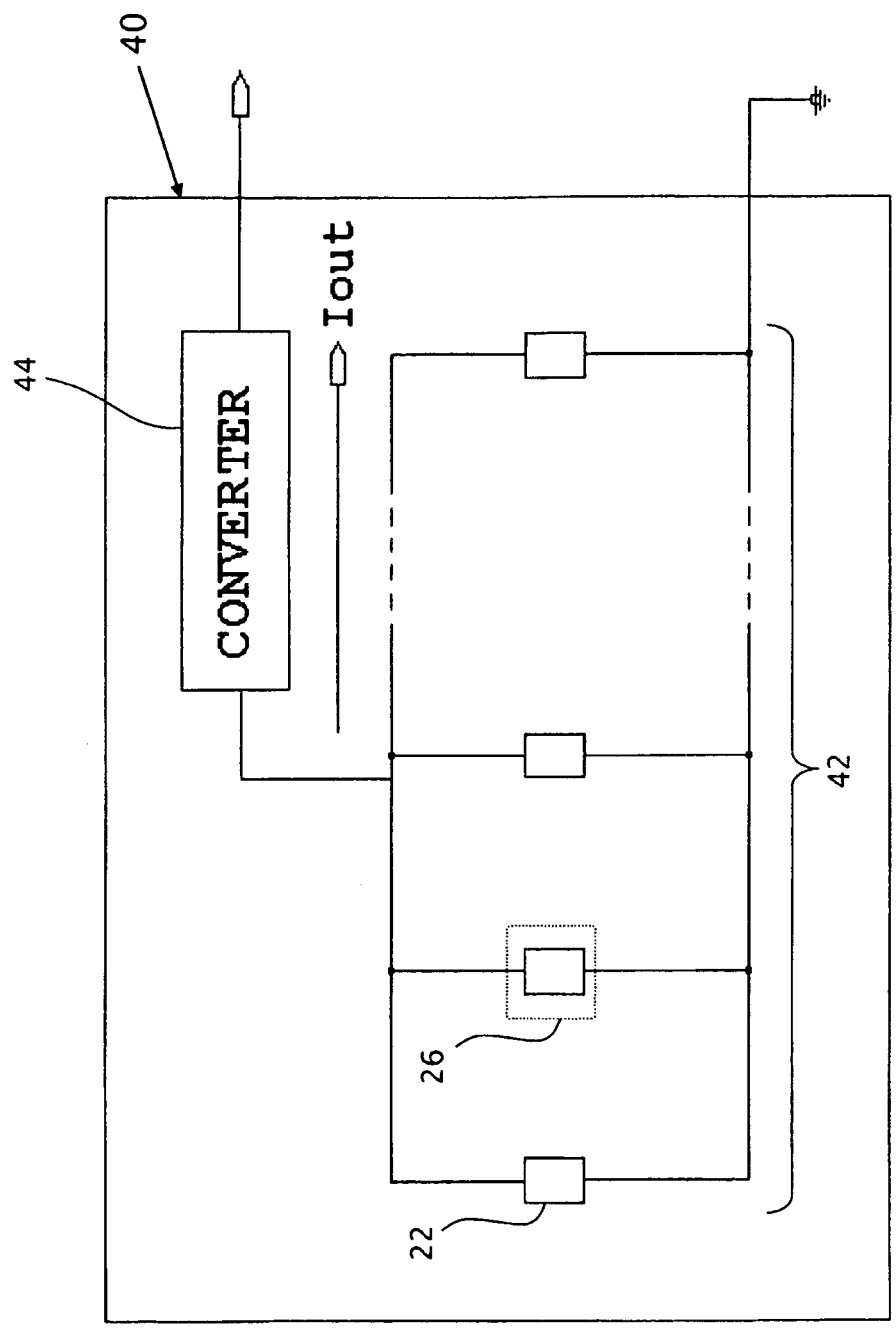
FIG. 3 (prior art) is a schematic block diagram showing a optimal solar-array system as in FIG. 3, wherein each serial-units includes a single solar cell and thus, serial-units are electrically connected in parallel.

In solar-array module 200, all solar cells 210 are electrically interconnected in a crisscross matrix configuration, to form a network 205 of solar cells 210. Hence each individual serial-unit 222 includes just one solar cell 210, whereby when a solar cell 210 malfunctions, the only power loss is that of that particular solar cell 210. The extra lines 232 added to the array of solar cells 210 reduce the damage inflicted by a malfunctioning cell 210, in the expense of cost and module area. Generally, solar-array module 200 can includes any number of serial-units 222, electrically connected in series, to form a string of serial-units 220. In the example shown in FIG. 4, Solar-array module 200 includes four serial-units 222 electrically connected in series to form a string of serial-units 220. The voltage level of four serial-units 222 electrically connected in series is relatively high (about 2V). With this input voltage, the input current of power converter 250 will be four time less than the input current of power converter 44 (FIG. 3), and power converter 250 efficiency is higher than the efficiency of power converter 44.

Figure 5:
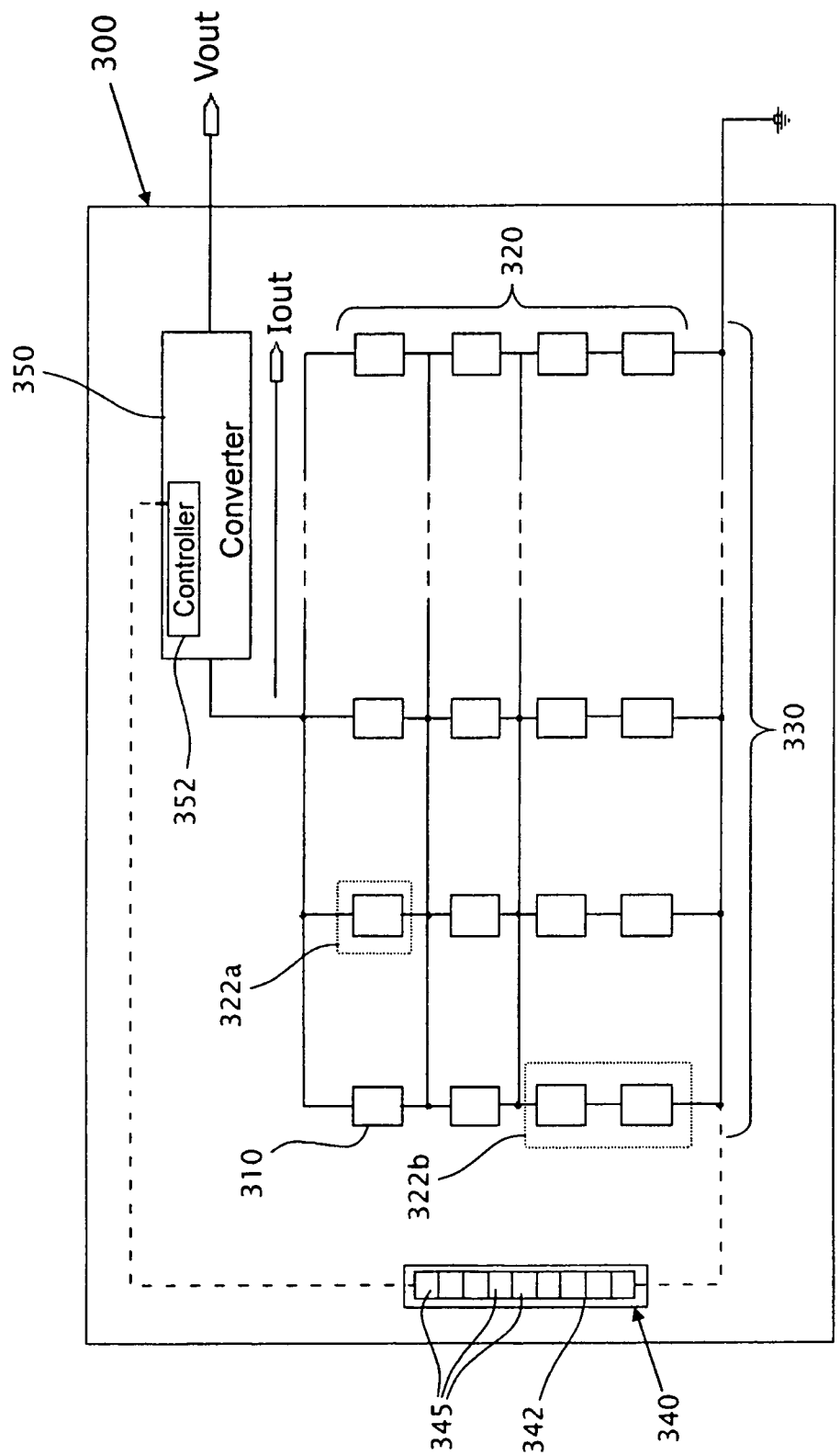
FIG. 5 is a schematic block diagram showing another solar-array module, wherein the cells are electrically connected in yet another exemplary crisscross matrix configuration, according to embodiments of the present invention.

Reference is also made to FIG. 5, which is a schematic block diagram showing another solar-array module 300, according to other variations of the present invention. In solar-array module 300, the electrically interconnectivity of solar cells 310 in the array of solar cells 310 is a compromise between solar-array module 30 (see FIG. 2) and solar-array module 200, for reducing costs. Hence, when a solar cell 22 that is a member of a serial-unit 26 is defective, the module loses the power of the whole serial-unit 26. When a solar cell 310 that is a member of a serial-unit 322b is defective, the module loses the power of the whole serial-unit 322b. When a solar cell 310 that is a member of a serial-unit 322a is defective, the module loses the power of that particular defective solar cell 310. Solar-array module 300 can include any number of serial-units 322 electrically connected in series to form a string of serial-units 320.

The suggested solution (as shown in FIG. 4 and FIG. 5) solves the problem of high current at the power converter (34, 44, 250 or 350) entrance on the one hand, and the problem of losses of power due to a defective solar serial-units (26, 222 or 322), on the other hand. The suggested solution provides a general solution and gives flexibility in solar-array module designing. An appropriate solar-array module design can be selected to provide the proper solution for a selected application.

When for example, a solar cell (210 or 310) malfunctions ("defective solar cell"), the solar serial-unit (222 or 322), to which the defective solar cell belongs, becomes a "defective serial-units", the string of serial-unit (220 or 320), to which the defective solar serial-unit (222 or 322) belongs, becomes a "defective string of serial-unit (220 or 320). The other solar cells (210 or 310) of the defective string of serial-units (220 or 320) continue producing power and are able to output their current $I_\Sigma$ through the parallel electrically connected functioning solar string of serial-units (220 or 320), all electrically connected in a crisscross matrix network, as described before. A portion of current $I_\Sigma$ that flows through the parallel electrically connected functioning solar string of serial-units (22, 220 or 320) is a current $I_u$:

$$Iu = \frac{I_\Sigma}{\left(\frac{m}{x} - n\right)} \tag{5}$$

where
m is the number of solar cells in the module.
x is the number of solar cells in a string of serial-units,
n the number of defective strings of serial-units.

In a solar-array module 300, for example, a 250 W solar-array module 300, having 60 solar cells 310 arranged in 15 strings of serial-units 320, wherein some serial-unit 322 includes 2 solar cells 310, 15 serial-units 322 are electrically connected in parallel, and two other functioning solar cells 310 are electrically connected in series to each serial-unit 322, all of which solar cells 310 are electrically interconnected in a crisscross matrix structure, as illustrated in FIG. 5. If a single solar cell 310 is defective, the whole serial-unit 322 that includes the defective cell becomes defective as well. The remaining two functioning solar cell 310, electrically connected in series to the defective serial-unit 322, continue to provide the produced current through parallel electrically connected solar string of serial-units 320.

Similarly, in a solar-array module 200 for example, in a 250 W solar-array module 200, having 80 solar cells 210 arranged in 20 strings of serial-units 220, wherein each serial-unit includes 1 solar cells 210 and 20 serial-units 222 are electrically connected in parallel and series, all of which solar cells 210 are electrically interconnected in a crisscross matrix structure, as illustrated in FIG. 4. If a single solar cell 210 is defective, that is single serial-unit 222 is defective, the remaining solar cells 210 of the defective string of serial-units 220 continues to provide produced current through parallel electrically connected solar cells 210.

An optional aspect of the present invention is to provide a start-up device (240 or 340) to provide the high voltage needed to operate the controller (252 or 352) of the power converter (250 or 350) of a solar-array module (200 or 300). A start-up device is required to generate the supply voltage for the controller (252 or 352) of the power converter (250 or 350). The start-up device (240 or 340) includes a multiplicity of small area, low power solar cells (245 or 345) electrically connected in series to form at least one string of solar cells (242 or 342). Optionally, several start-up devices (240 or 340) are dispersed inside the module (200 or 300), to reduce partial shading effect. Optionally, all start-up devices are electrically connected to in parallel. The array of start-up devices (240 or 340) is electrically connected to the power converter (250 or 350). It should be noted that the number of cells in each string of cells may vary according to the solar-array module (200 or 300) and/or power converter (250 or 350) specifications.

Example

For a prior art solar module having 60 solar cells 22 electrically connected in series, whereas for each 6 solar cells 22 there is a bypass diode 25 electrically connected in parallel, to form a unit string. Now the prior art solar module is compare to a solar module of the present invention, with the same number of cells, but all cells are electrically interconnected in a net structure as described FIG. 5. Both modules are designed to produce 250 W of electric power.

| Number of defective units | Prior art solar-array module total power | Innovative solar-array module total power |
|---|---|---|
| 1 | 218 | 232 |
| 3 | 160 | 216 |

Figure 1A:
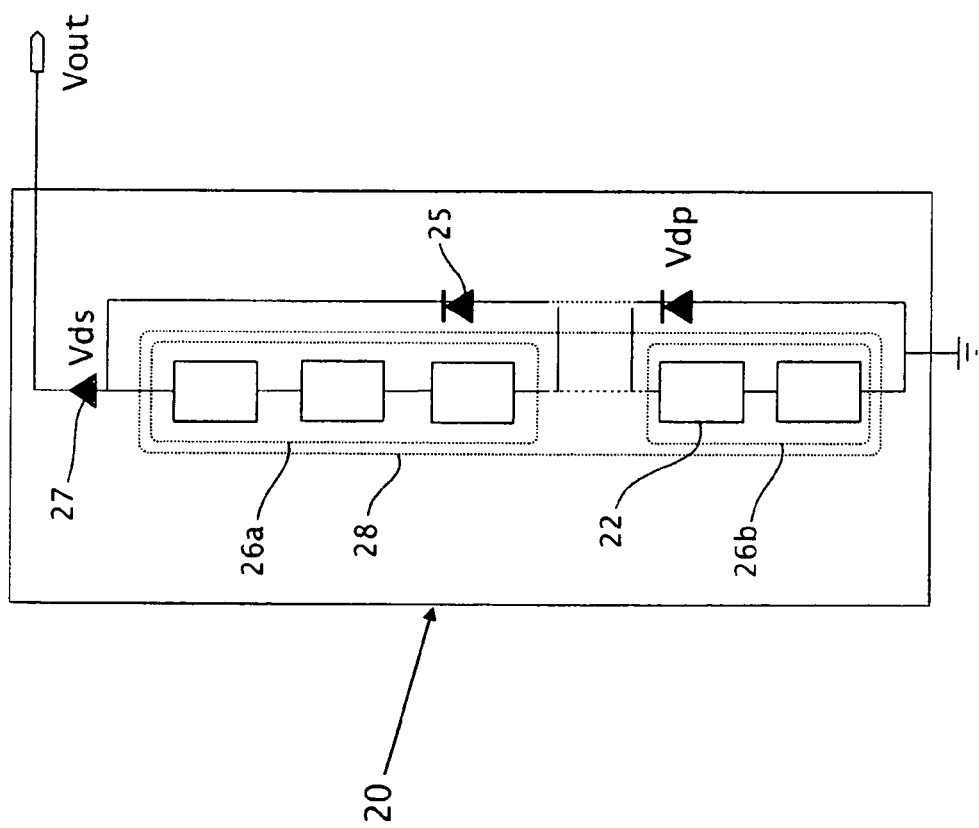
FIG. 1a (prior art) is a schematic block diagram showing a conventional solar module with multiple cells electrically connected in series to form serial-units, wherein each serial-unit is protected by a bypass diode, wherein the serial-units may be interconnected in series to form a string of serial-units, and wherein each module is protected by a series diode.
Figure 1B:
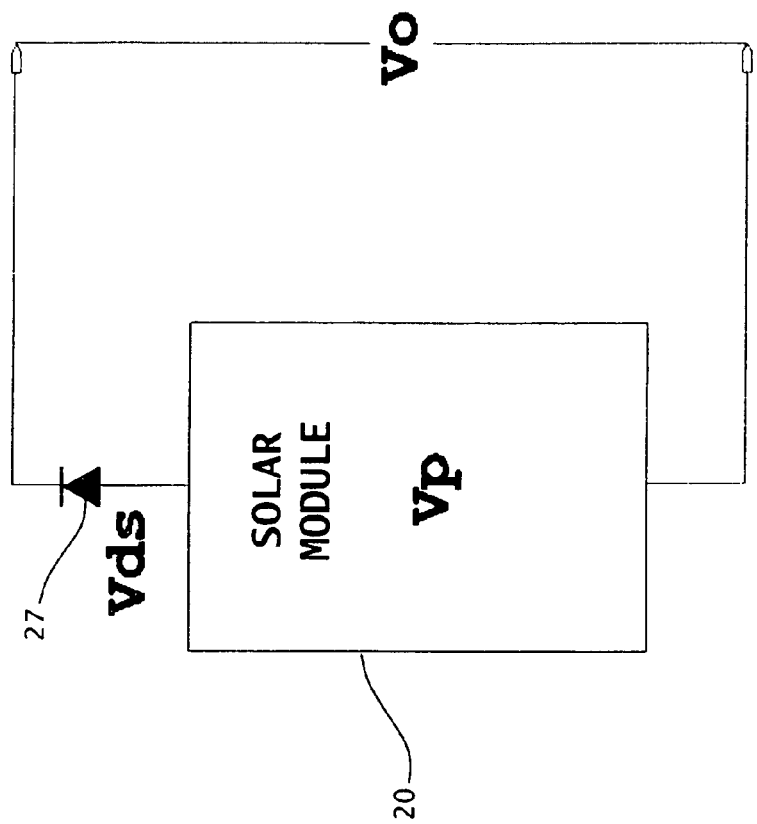
FIG. 1b (prior art) is a schematic block diagram showing the voltages across the module including voltage drop on series diode.
Figure 2:
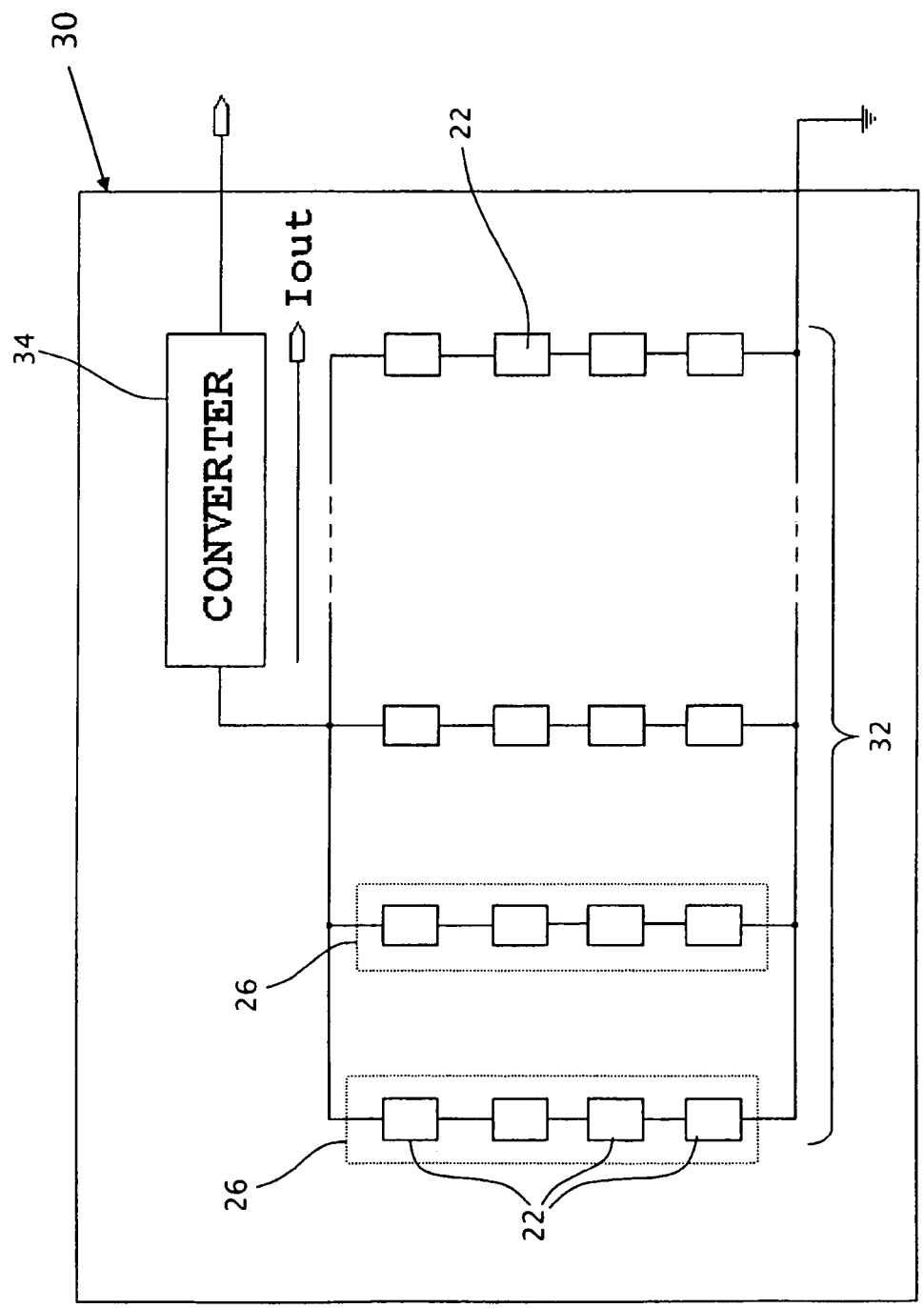
FIG. 2 (prior art) is a schematic block diagram showing a solar array system including multiple serial-units electrically connected in parallel, according to embodiments of the present invention.
Figure 6:
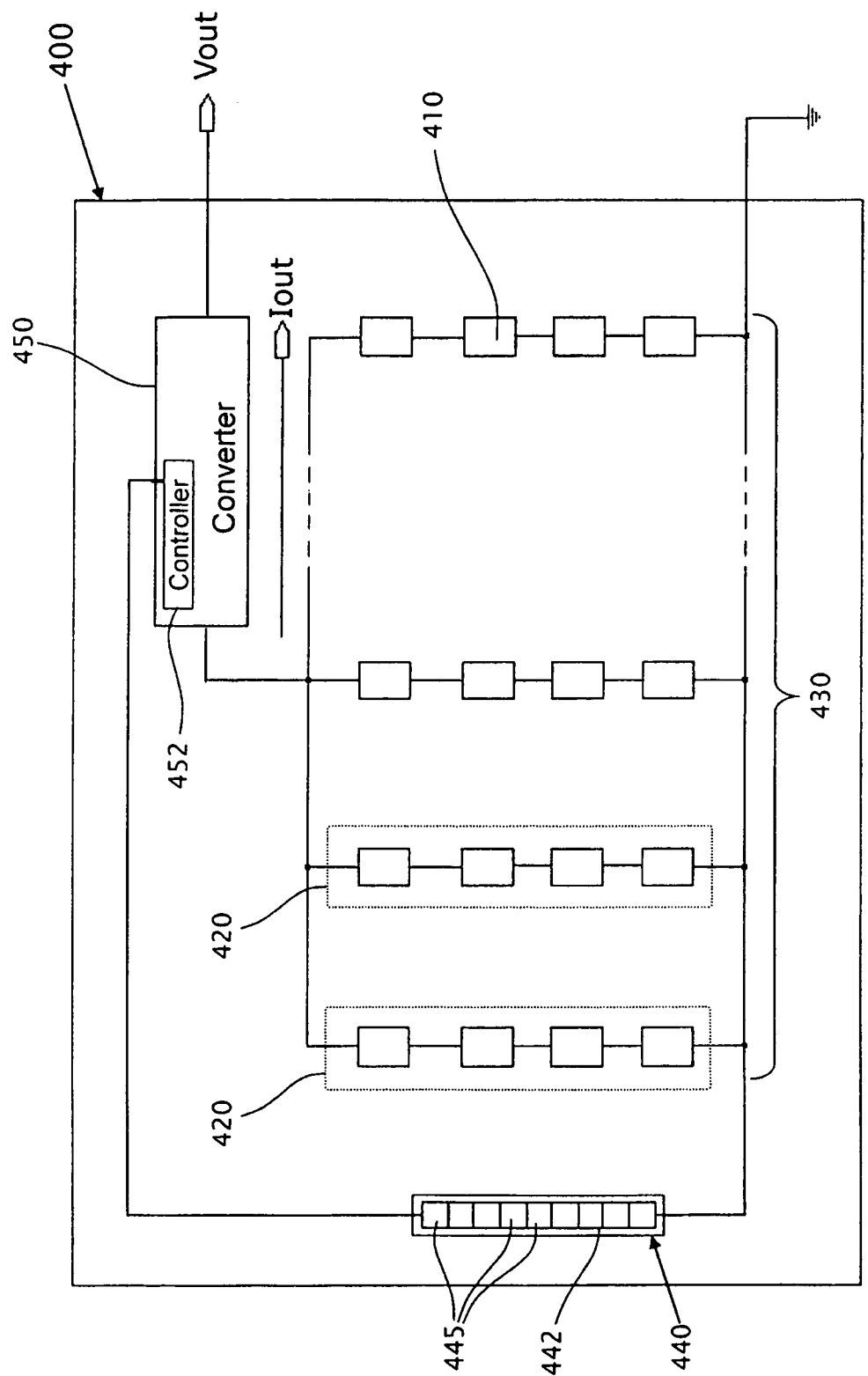
FIG. 6 is a schematic block diagram showing a solar array module as in FIG. 2, wherein the solar-array module further includes a secondary array of solar cells used to start up the convertor, according to embodiments of the present invention.
Figure 7:
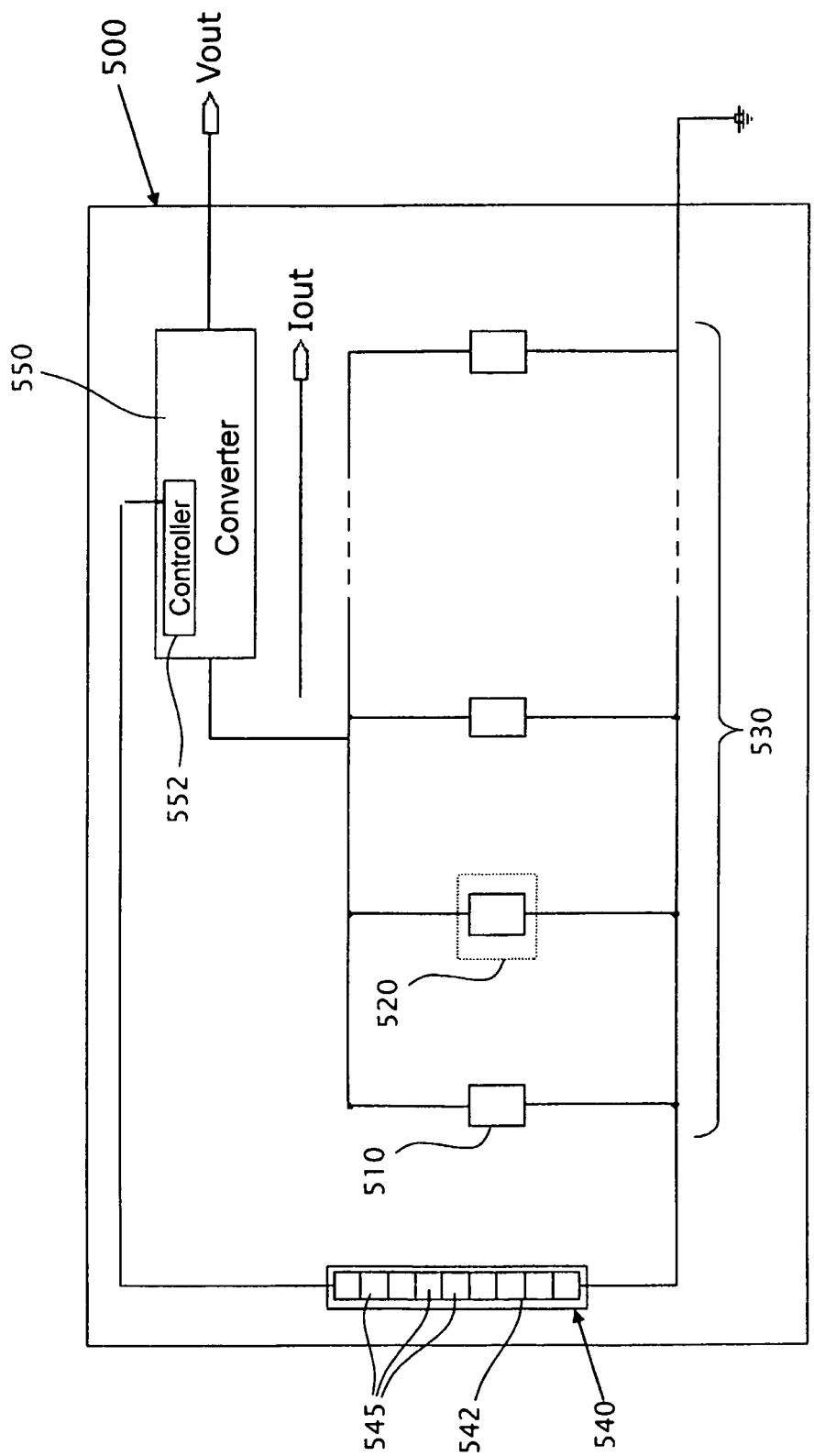
FIG. 7 is a schematic block diagram showing a solar-array module as in FIG. 3, wherein the solar-array module further includes a secondary array of solar cells used to start up the convertor, according to embodiments of the present invention.

Reference is also made to FIG. 6—a schematic block diagram showing a solar-array module 400, which is similar to solar-array module 30, shown in FIG. 2, wherein solar-array module 400 further includes a start-up device 440, used to start up a convertor 450, according to embodiments of the present invention. The start-up device 440 includes a secondary array 442 of solar cells 445. Reference is also made to FIG. 7—a schematic block diagram showing a solar-array module 500, which is similar to solar-array module 40, shown in FIG. 3, wherein solar-array module 500 further includes a start-up device 540, used to start up a convertor 550, according to embodiments of the present invention. The start-up device 540 includes a secondary array 542 of solar cells 545. A start-up device is required to generate the supply voltage for the controller (452 or 552) of the power converter (450 or 550).

Figure 8:
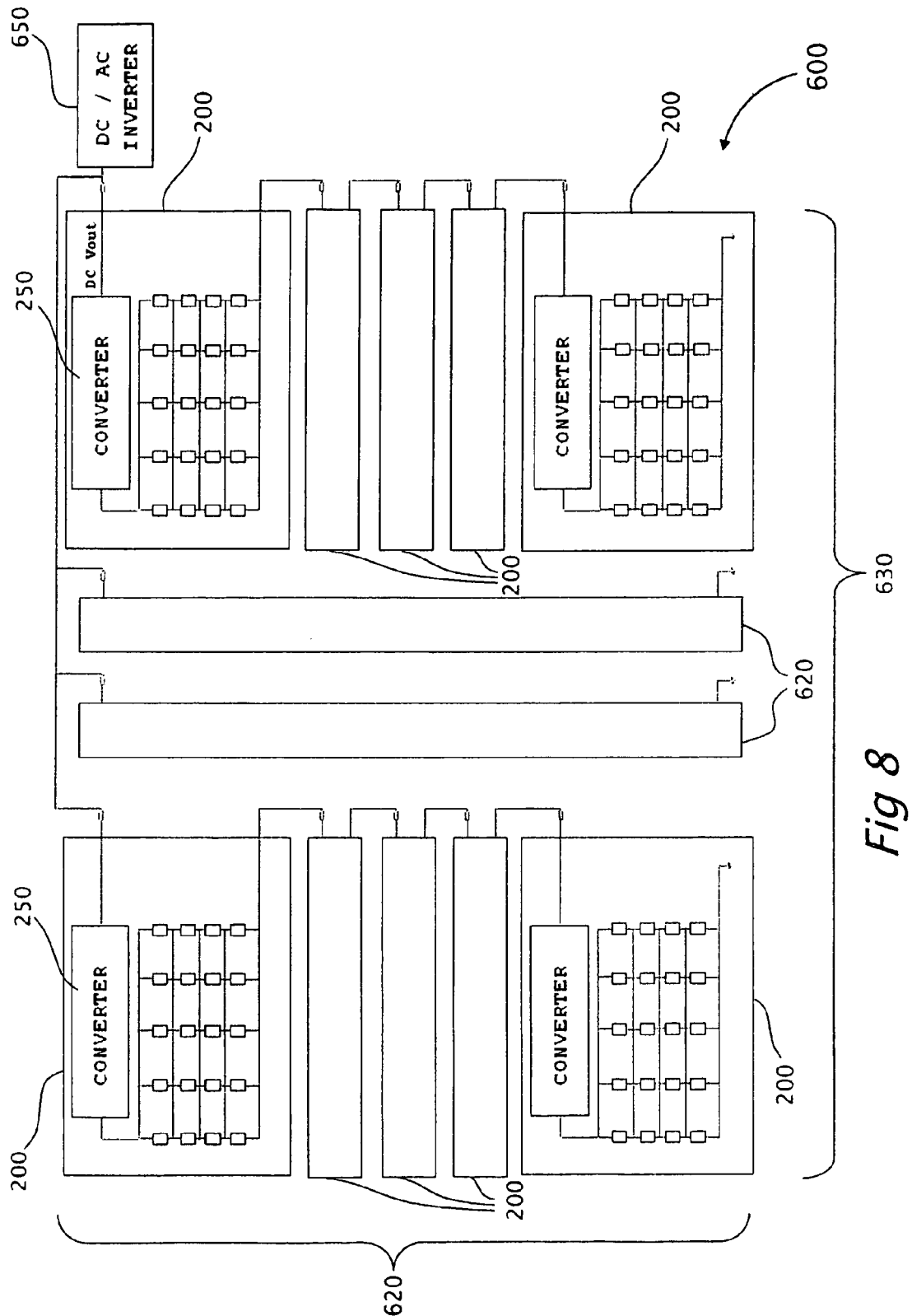
FIG. 8 is a schematic block diagram showing a solar-array system including a multiplicity of solar-array modules, such as shown in FIG. 4, according to embodiments of the present invention.

An aspect of the present invention is to provide a solar-array system for generating electric power, composed of multiple solar-array modules. Reference is made to FIG. 8—a block diagram showing a solar-array system 600 that includes a multiplicity (in this example—4) of solar-array modules 200, according to embodiments of the present invention. Solar-array modules 200 are electrically connected in series through the respective power converter 250 of each solar-array module 200, to form a string of solar-array modules 620. The voltage produced by solar-array system 600 is the sum of voltages provided by the power converters 250 of a string of solar-array modules 620.

Solar-array system 600 further include one or a plurality of similar strings of solar-array modules 620, which strings of solar-array modules 620 are electrically connected in parallel (630), to provide the total power desired via a single voltage output (DC Vout) of solar-array system 600.

Optionally, the output voltage, DC Vout, of system 600, is provided to an inverter 650 that is configured to convert the DC output of system 600 to an AC output, which is preferably electrically connected to the public electric grid.

Figure 9:
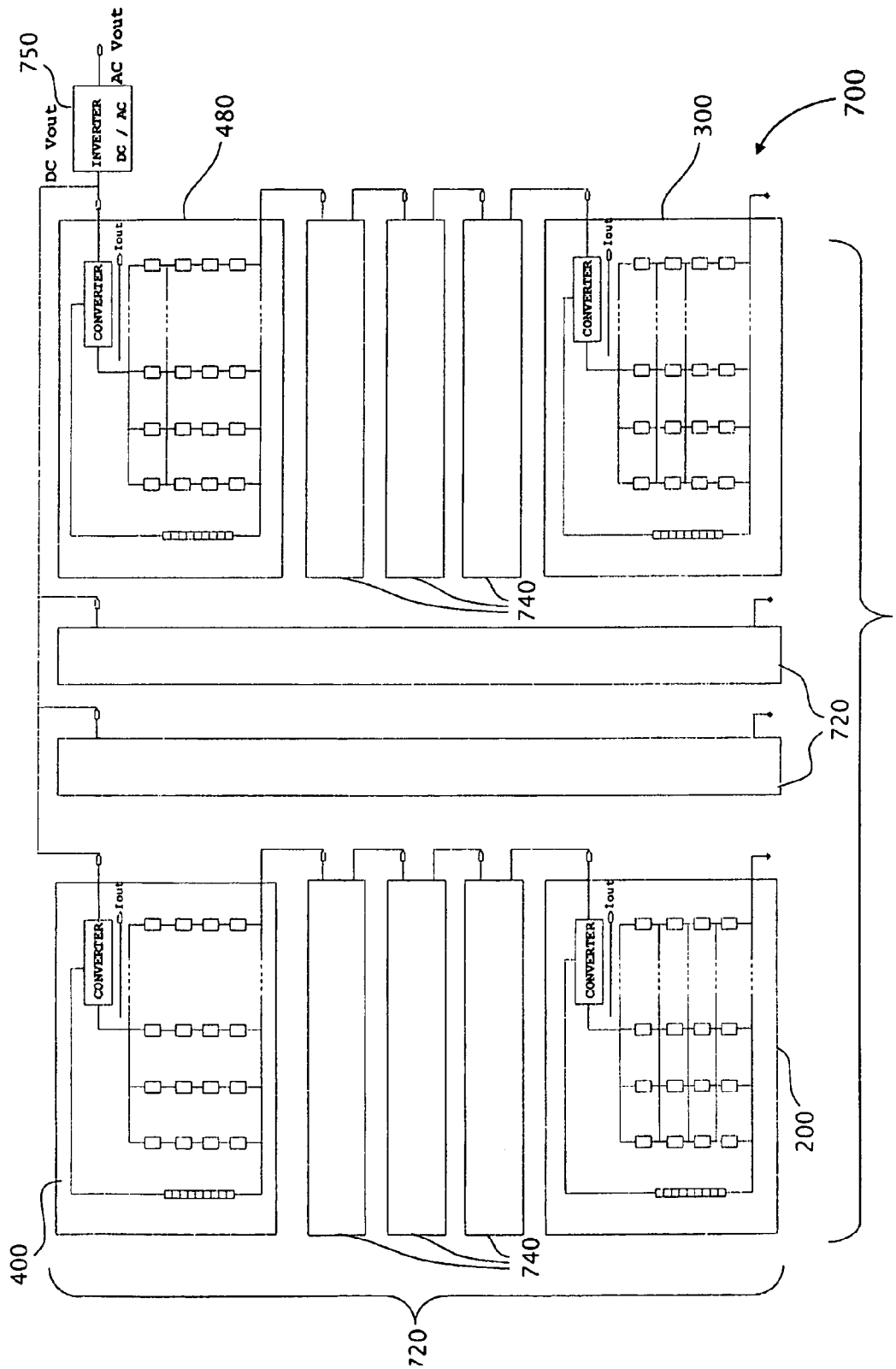
FIG. 9 is a schematic block diagram showing a solar-array system including a variety of solar-array modules, according to embodiments of the present invention.

Reference is also to FIG. 9—a block diagram showing an solar-array system 700 that includes a multiplicity (in this example—4) of a variety of solar-array modules (200, 300, 400 and 480), according to embodiments of the present invention. Solar-array modules 200, 300, 400, 480 and other configurations of solar-array modules 740 are electrically connected in series through the respective power converter (250, 350, 450 and 550) of each solar-array module (200, 300, 400, 480 and 740), to form a string of solar-array modules 720. The voltage produced by solar-array system 700 is the sum of voltages provided by the respective power converter (250, 350, 450 and 550) of a string of solar-array modules 720.

Solar-array system 700 further include one or a plurality of similar strings of solar-array modules 720, which strings of solar-array modules 720 are electrically connected in parallel (730), to provide the total power desired via a single voltage output (DC Vout) of solar-array system 700.

Optionally, the output voltage, DC Vout, of system 700, is provided to an inverter 750 configured to convert the DC output of system 700 to an AC output, which is preferably electrically connected to the public electric grid.

Figure 10:
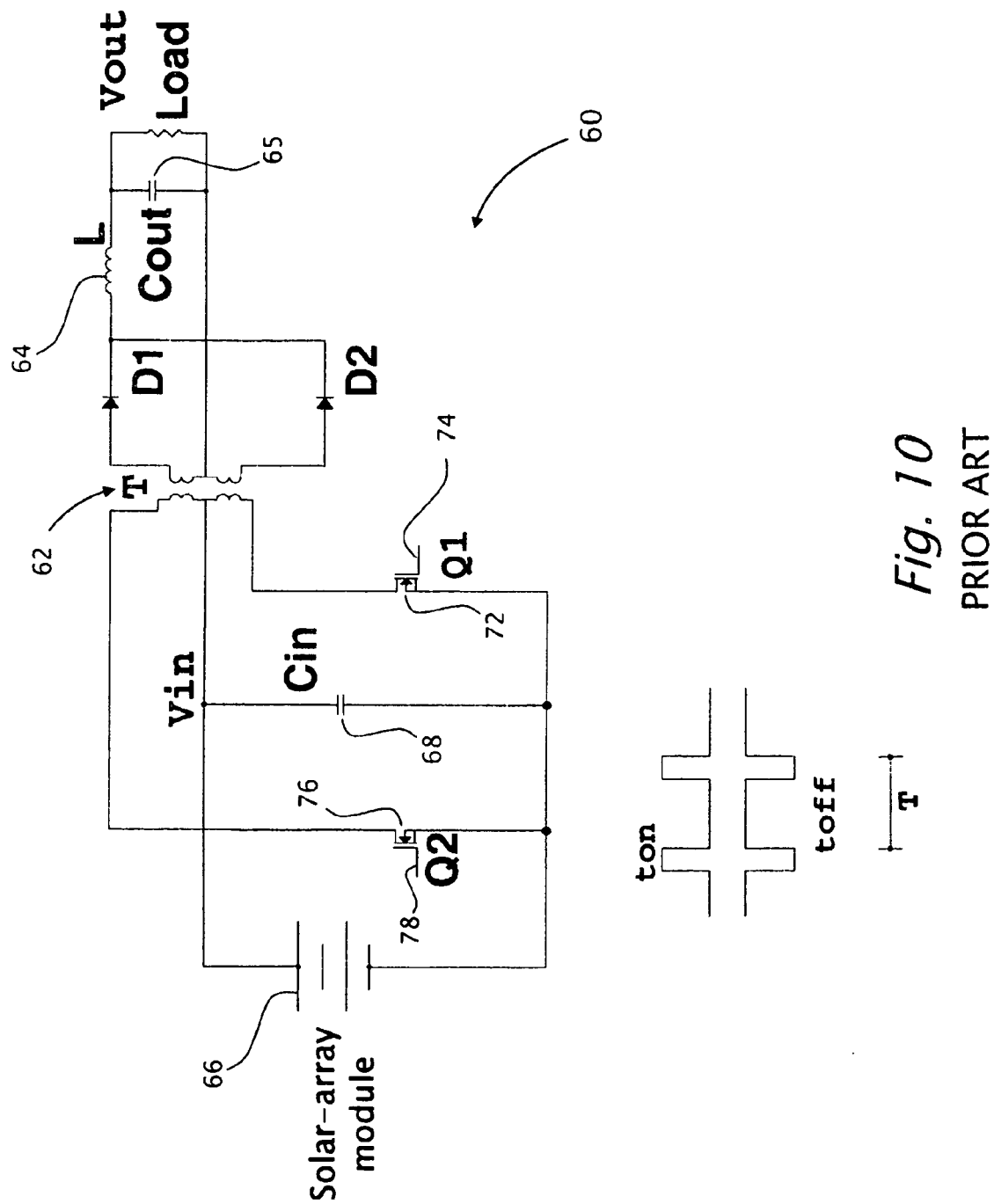
FIG. 10 (prior art) is an electric circuit diagram showing a DC to DC power converter using a Push-Pull topology design.

Reference is now made to FIG. 10—an electric circuit diagram 60 showing an example of a DC to DC power converter using a Push-Pull topology, as known in the art. The switching transistors 76, 72 alternately connect opposite ends of the primary coil of the transformer 62 to the (−) side of a DC power source 66, while the center of the primary coil is fixedly connected to the (+) side of DC power source 66. Transistors 76, 72 are activated into their ON, OFF states by the respective input control voltages 78, 74.

Figure 11:
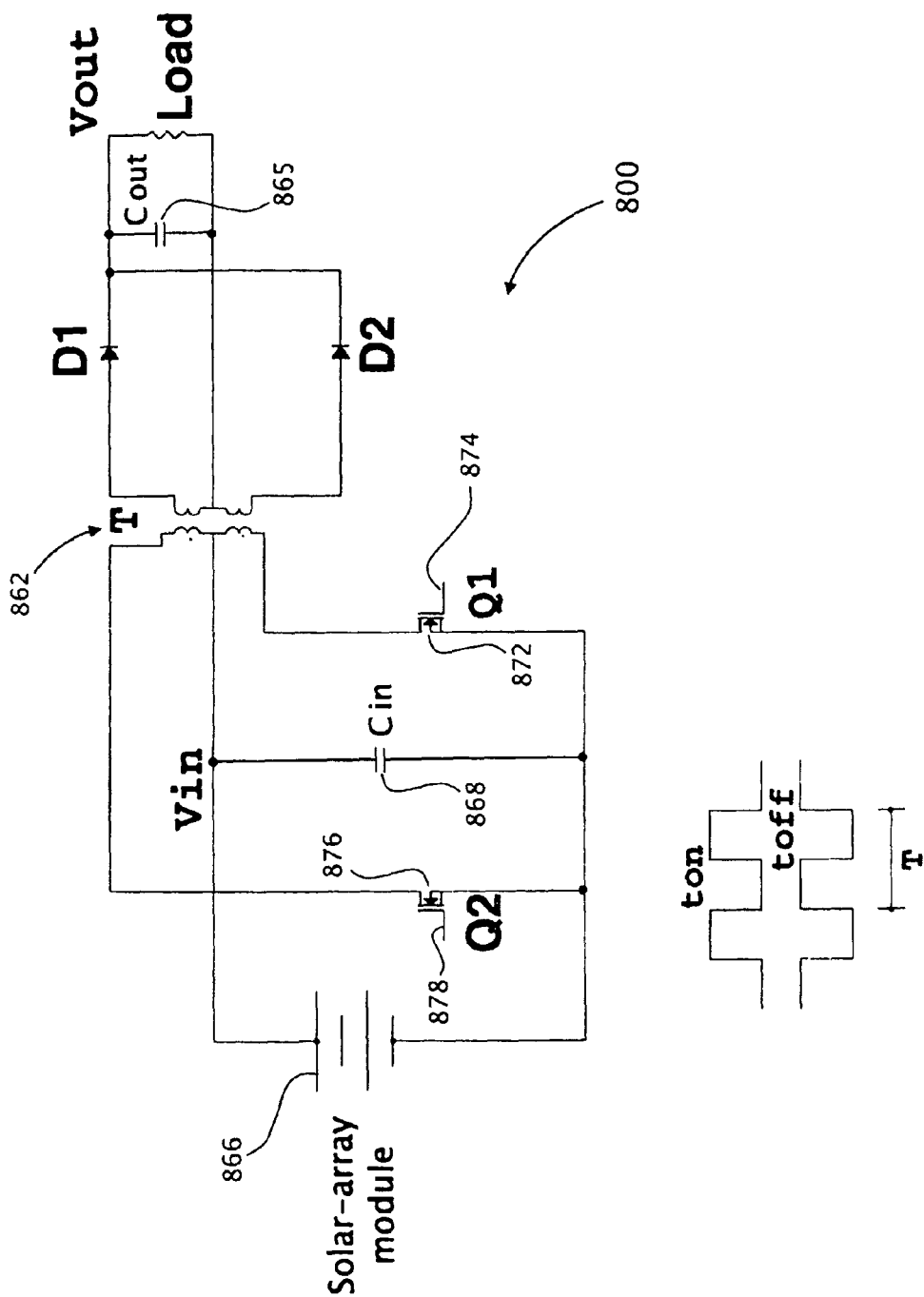
FIG. 11 is an electric circuit diagram showing a DC to DC power converter without the output coil and in conjunction with solar-array modules, which use solar cells electrically connected in a crisscross matrix array.

FIG. 11 details the electric circuit diagram 800 of a DC to DC Push-Pull power converter according to the present invention. The output coil 64 (see FIG. 10) was removed, as it is no longer necessary.

The input capacitor 68 that would be positioned in the circuit at position 868 can have a smaller value or may be removed altogether as shown. The output capacitor 65 that would be positioned in the circuit at position 865 can have a smaller value or may be removed altogether as shown.

Figure 12A:
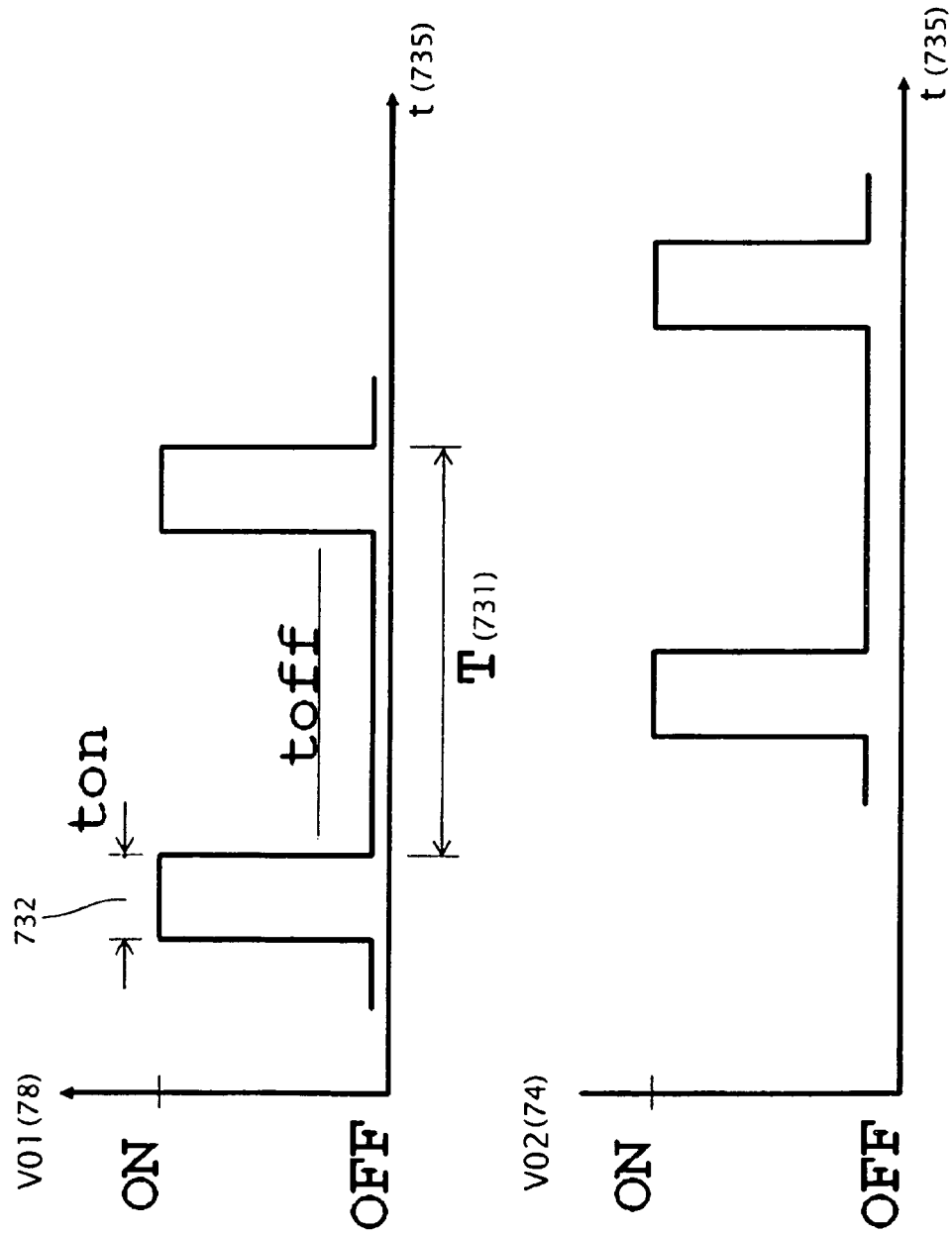
FIG. 12a is a diagram of switching times of a prior art power converter.

FIG. 12A details switching times of the prior art Push-Pull power converter 60, showing the control voltage for MOSFET transistors 76 and 72 vs. time 735. In prior art, the duty cycle of these pulses is significantly smaller than 50% and is not constant. That is, the ON state time 732 is significantly shorter than half the period time 731. It should note that a MOSFET transistor is given by way of example only, and other types of transistor, suitable to the application, may be used within the scope of the present invention.

These waveforms cause ripple in the circuit, which require relatively large values of the input capacitor 68; output coil 64 and output capacitor 65. Such large values result in a costly implementation and bulky components. Input capacitor 68 rated for high currents may be very expensive.

Moreover, the large currents in the capacitors 68 and 65, and the resistance of the large coil 64, result in significant ohmic losses, thus reducing the converter's efficiency. Therefore, this prior art power converter may be expensive, bulky and with a low efficiency.

It is the intention of present invention to provide an innovative power converter that is an efficient and low cost power converter, in conjunction with, crisscross matrix of solar cells arrays of solar-array modules and solar-array systems (see for example, FIG. 4, FIG. 5, FIG. 8 and FIG. 9).

Figure 12B:
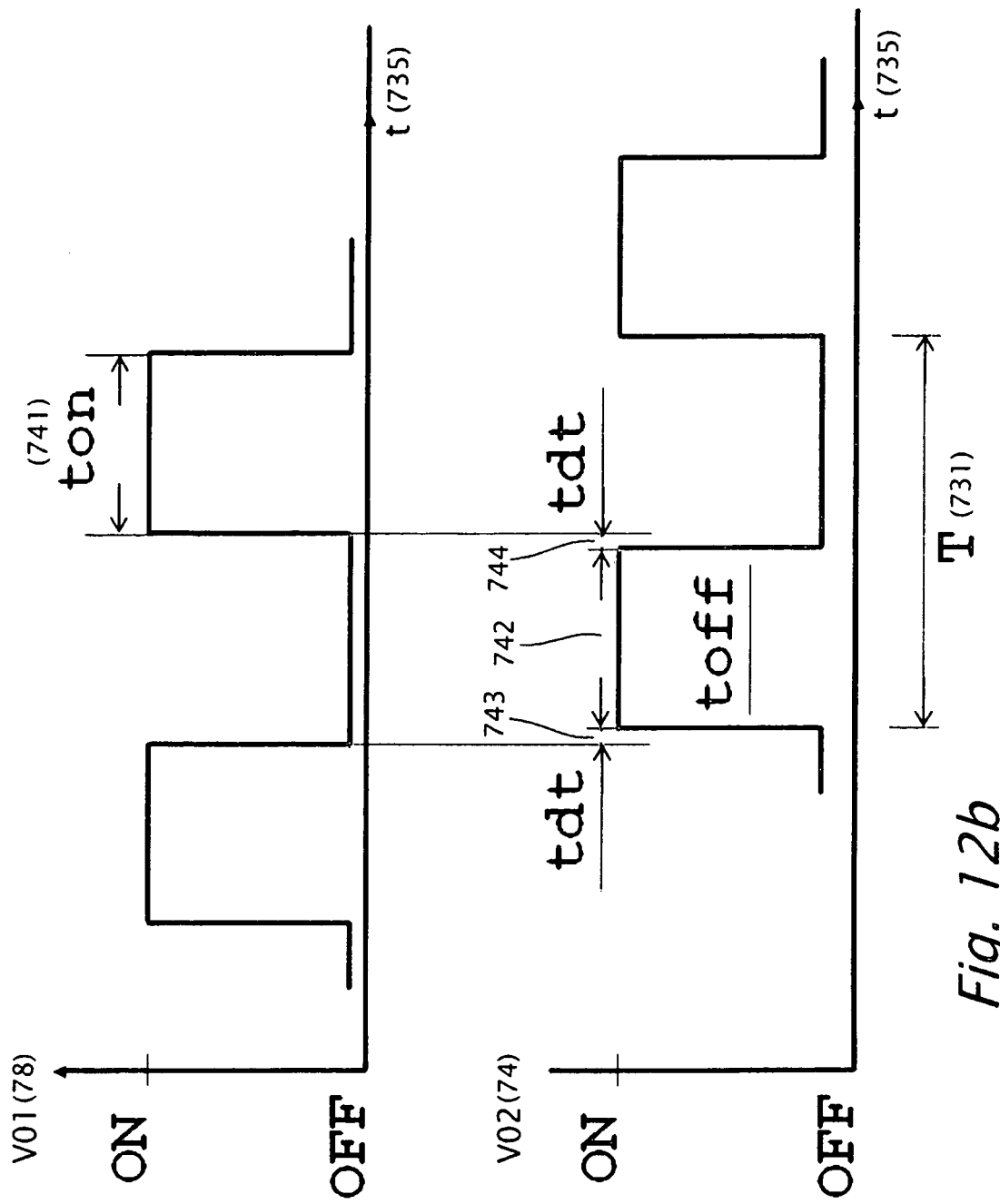
FIG. 12b is a diagram of switching times of a power converter, in conjunction with solar-array modules which use solar cells electrically connected in series and/or in parallel.

FIG. 12B details switching times of a power converter 800, showing the control voltage for the MOSFET transistors 876 and 872 vs. time 735.

The ON time 741 of the MOSFET transistors in FIG. 12B is almost 50%. The OFF time 742 of the MOSFET transistors in FIG. 12B is almost 50% also. Hence, the operational duty cycle of the MOSFET transistors 876 and 872 is constant and is just less than 50% (almost 50%), wherein the duty cycle is defined as:

Duty cycle=ON time(741)/$T$(731).

The "dead" time 743 between the switching time ON to OFF of one MOSFET transistor, and the switching OFF to ON of the other MOSFET transistor is a very, very small time relating to the ON and OFF time periods, this to prevent both MOSFET transistors 876, 872 from conducting simultaneously. The same consideration applies to the "dead" time 744. Through transformer 862 in diagram 800 flows a current which is only interrupted just in very small "dead" time intervals 743 and 744. The power converter operates almost like a DC/DC transformer with small input voltage and high output voltage. Thus very small current interrupt for "dead" time intervals 743 and 744, greatly reducing the ripple in the power converter input and output circuits. Significantly smaller values or may be completely deleting of the input capacitor 868, output coil 864 and output capacitor 865 can be used, to reduce costs, as well as the weight and volume of the power converter and to increase the power converter's efficiency.

Figure 13:
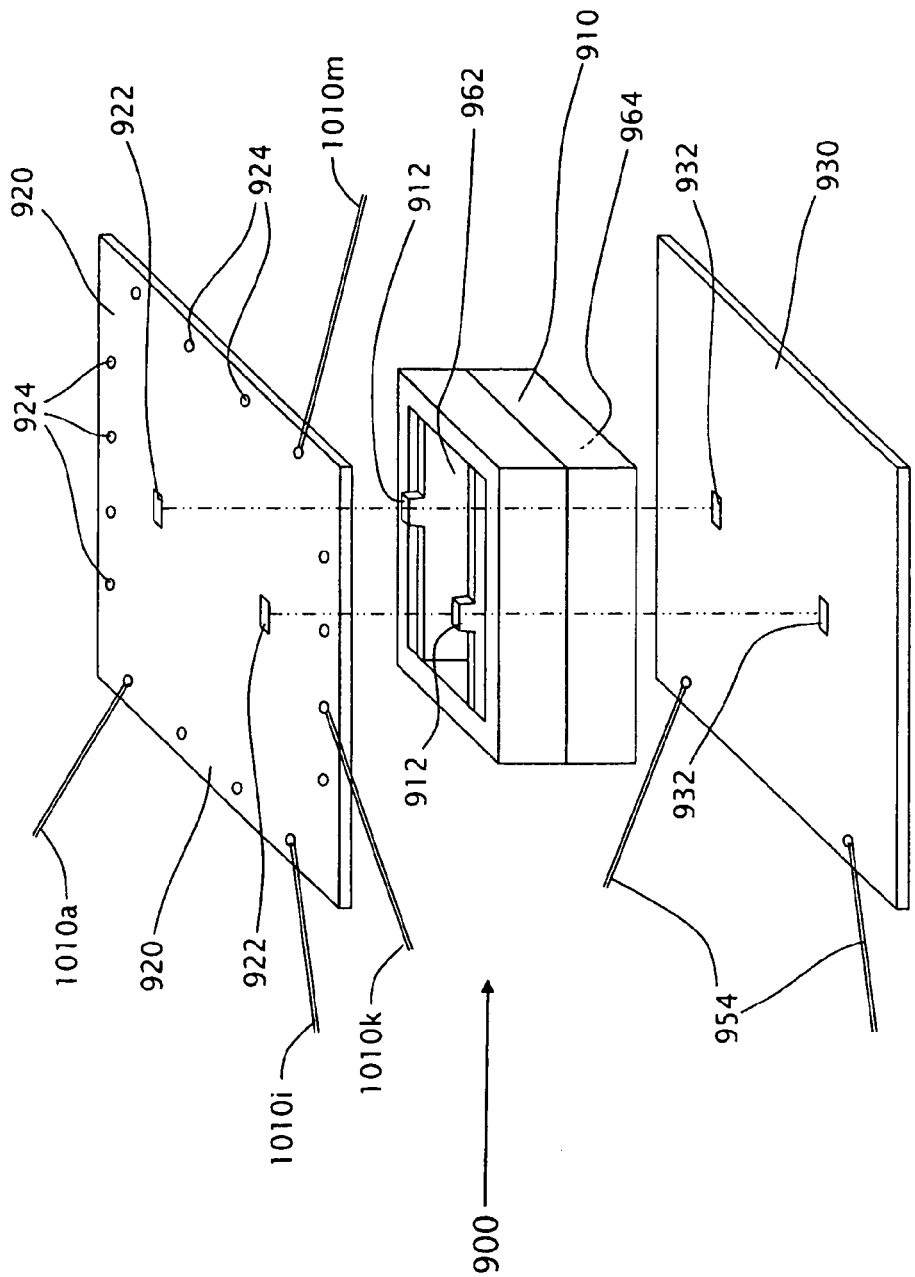
FIG. 13 is a perspective view of a structure of a DC to DC power converter, according to embodiments of the present invention.

FIG. 13 details the structure of a DC to DC power converter, according to variations of the present invention, with a planar transformer 900. The transformer 900 includes a ferromagnetic core 910 and coils, input coil leads 912 and output coil leads (not shown on the down side of transformer 900). Ferromagnetic core 910 includes two window openings formed at the opposing ends of ferromagnetic core 910.

Only the structure of the circuit to the primary coil is detailed, because here we have a high current due to the low voltage; the secondary has a higher voltage thus a lower current, so losses in the wiring are much lower.

The leads 912 of the transformer's primary coil are connected to an input printed circuit 920 and the leads of the transformer's secondary coil are connected to an output printed circuit 930, respectively. To connect the wires as required, there are receiving holes 922, formed in input printed circuit 920, facilitating direct electrical connection input coil leads 912 and holes 924 for wires 1010 of strings of serial-units, in the input printed circuit 920. The output printed circuit 930 has receiving holes 932 for output coil leads (not shown) and holes for the power converter's output wires 954.

The input printed boards 920 and a output printed board 930 placed very tightly to planar transformers 900, onto windows 962 and 964, respectively.

The input and output switching circuits are divided into two small printed boards 920 and 930, each mounted close to one of the two openings formed at the opposing ends of ferromagnetic core 910. Thus, the leads 912 of the primary and secondary coils of the transformer will reach directly, in the shortest path possible, to the switching circuits. This structure minimizes the length of the wires and the dimensions of the power converter.

Structure 900 reduces copper losses in the wiring and improves the efficiency of the power converter. The overall current flows in printed circuits 920 and 930, which printed circuits are so designed as to have a very small resistance. Only very short wiring is required from input printed circuit 920, to the primary coil in the transformer 910 and only very short wiring is required from output printed circuit 930, to the secondary coil in the transformer 910.

Moreover, shortens switching lines decreases the area of the loop for RFI in the switching input and output electrical circuits, thus reducing Radio Frequency Interference (RFI).

Preferably, printed circuits 920, 930 are implemented as a multilayer printed circuit board (PCB), with a grounded shielding surface; this further contributes to avoid electromagnetic radiation. Furthermore, the transformer is contained in a ferromagnetic structure, made for example of ferrite; this also contributes to avoid electromagnetic radiation and to reduce RFI to the environment. Thus structure operates as FARADY enclosure. An "environmentally green" product is thus achieved.

Figure 14:
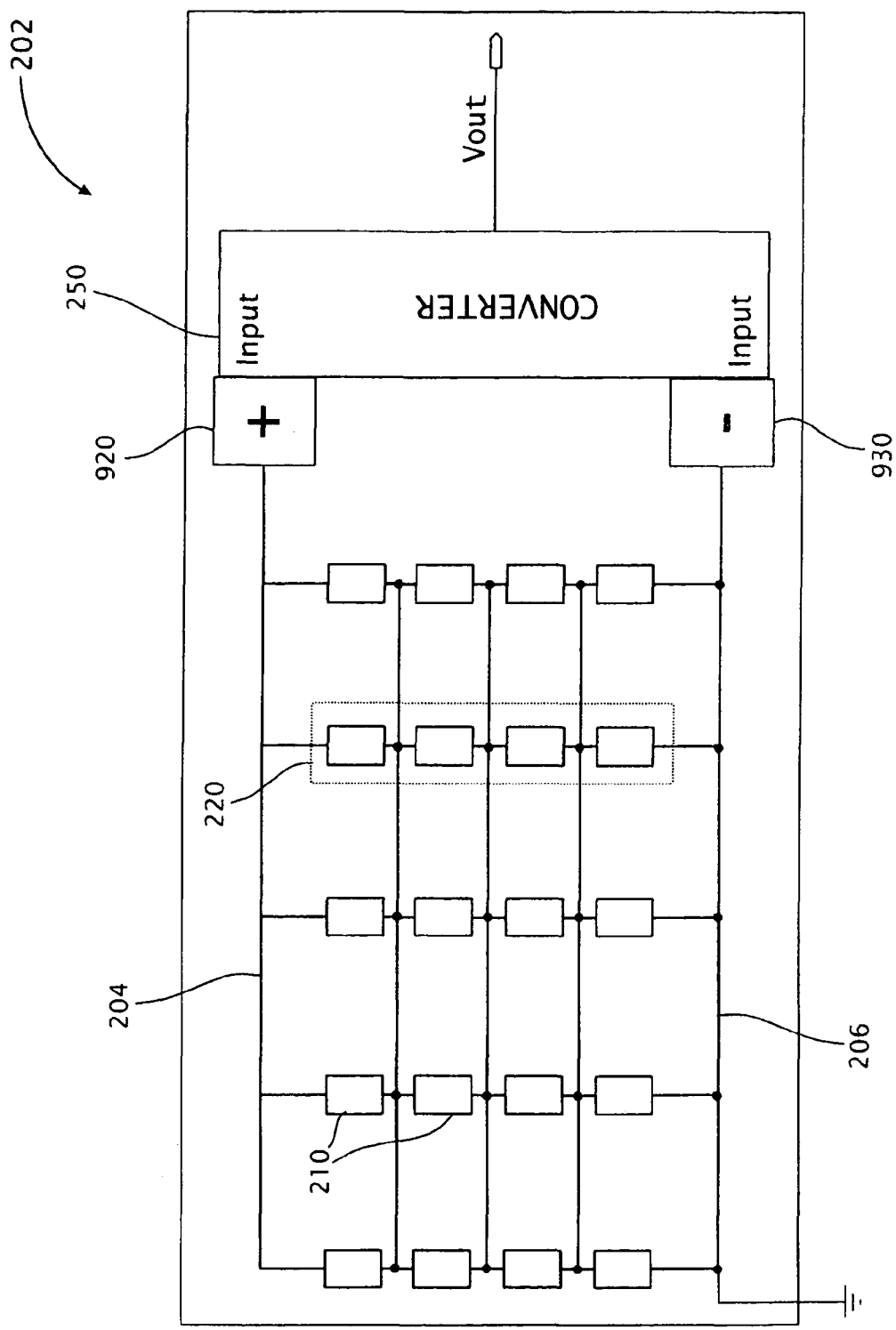
FIG. 14 is a schematic block diagram of a solar-array module, wherein the strings of serial-units are electrically connected to each of the DC to DC power converter pads by single mutual line.

FIG. 14 details regular electrical connections from solar cells 210 to the converter's pads 920 (plus conductive pad) and 930 (minus conductive pad). FIG. 14 is a schematic block diagram of a solar-array module 202, wherein the solar cells string of serial-units 220 are electrically connected to each of the DC to DC power converter pads 920 and 930 by single mutual line 204 and 206, respectively.

A possible problem with low voltage solar cells is ohmic losses in the wiring from string of serial-units 220 to the DC to DC power converter 250. For example, assuming a 250 Watt solar array module, having 60 solar cells 210, wherein every 4 solar cells 210 are electrically connected in series to form a string of serial-units 220 of solar cells 210, and the string of serial-units 220 are also electrically interconnected in parallel, to form crisscross matrix having 15 strings of serial-units 220 each including 4 solar cells (see for example FIG. 14); in such configuration:

The input voltage to power converter 250 is about 2 Volt (each solar cell 210 generates about 0.5 Volt, and there are 4 solar cells in series). The total input current to power converter 250 will be more of 125 Amp, according to the efficiency of power converter 250.

The current of one string of serial-units 220 of solar cells 210 (about 8.3 Amp) is multiplied by the 15 of string of serial-units 220 in parallel to yield the total current flowing in the wires 204 and 206 from the string of serial-units 220 to power converter 250. Thus, the total current may exceed values of 125 Amp.

For example: the solar-array module is about 0.9 meter wide. For copper wires 204 and 206 of 1 mm thickness and 10 mm width, in a conventional embodiment, the ohmic losses in the wires is approximately 26.5 Watt. This is a loss of 10.6% for a power converter of 250 Watt, a quite unacceptable value.

If thicker wires are used, the ohmic losses decrease. For example: for wires 204 and 206 of a 15 mm by 10 mm cross section, the losses will be about 1.8 Watt.

This is a reasonable value, however, thicker wires 204 and 206 are rigid and have a large size, weight and cost, a quite unacceptable value.

Figure 15:
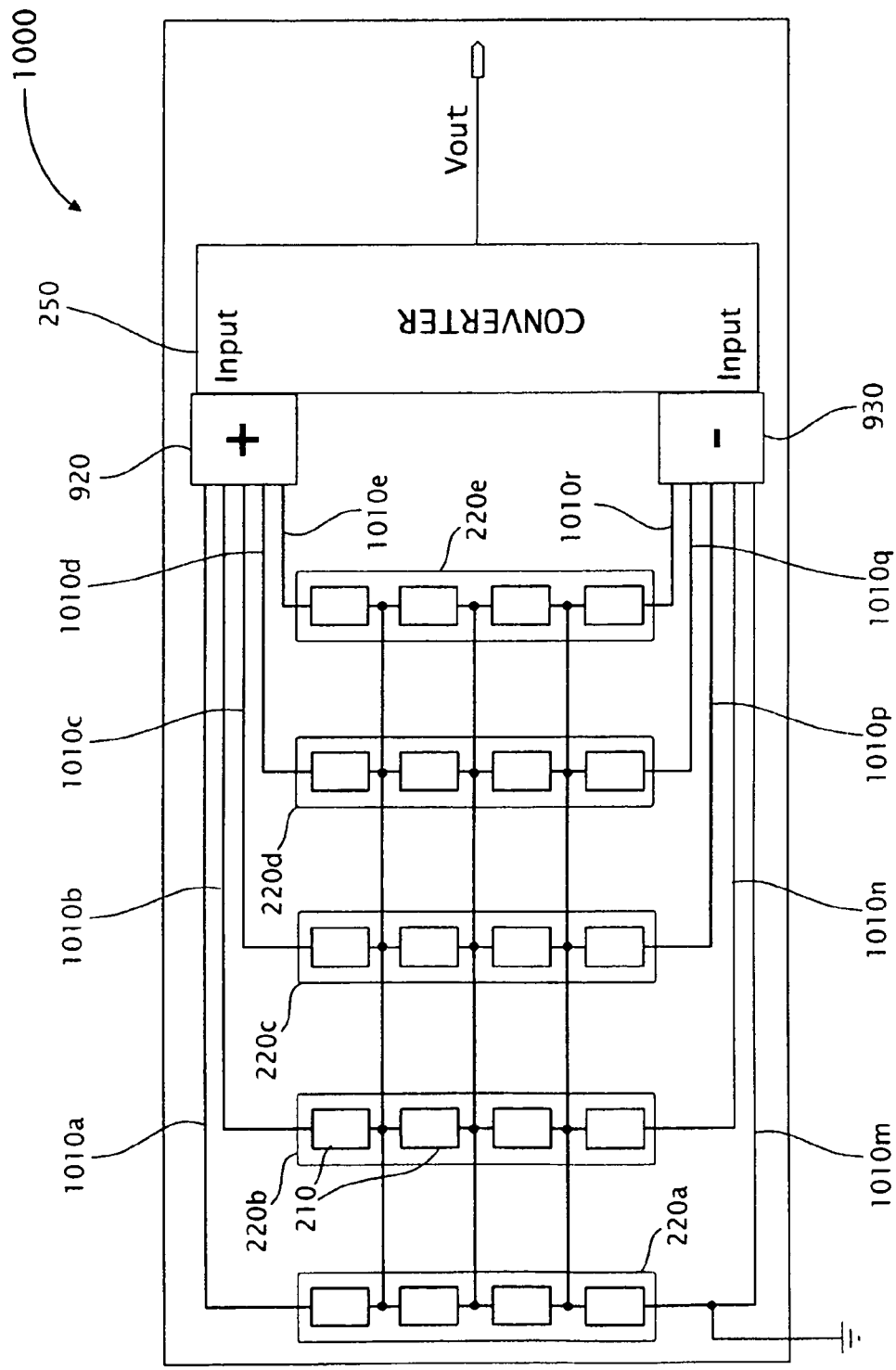
FIG. 15 is a schematic block diagram of a solar-array module, wherein the strings of serial-units are individually electrically-connected to each of the DC to DC the power converter's pads.

FIG. 15 details electrical connections from the solar cells to the power converter pads, according to the present invention. FIG. 15 is a schematic block diagram of a solar-array module 1000, wherein the strings of serial-units 220 are individually electrically-connected to each of the DC to DC power converter pads 920, 930. Throughout the present disclosure, a string is defined as a plurality of solar cells connected in series, and a string of serial-units 220 is defined as a plurality of solar cells 210 electrically connected in series as well as the of solar cells 210 parallel electrically connected to the respective solar cells 210 in the adjacent strings of serial units 220. In the present example, each string of serial-units 220 includes four solar cells.

A solar-array module includes a plurality of strings of serial-units 220 and one DC to DC power converter 250. The plus (+) side of each string of serial-units 220 is electrically connected to the plus conductive pad or (+) pad 920 of the power converter. The (+) pad 920 of power converter 250 is implemented as a wide and large area pad, which is mounted close to the power converter 250 input, in order to reduce copper losses. The minus (−) side of each strings of serial-units 220 is electrically connected to the minus conductive pad or (−) pad 930 of power converter 250, which is also implemented as a wide and large area pad, mounted close to the power converter 250 input, in order to reduce copper losses.

In the above example, the matrix array of solar-array module 1000 (for example of 250 Watts) includes 15 strings of serial-units 220, the current in each string of serial-units will be about 8.3 Amp. Through each string of serial-units 220 flows a maximal electric current as large as each solar cell 210 can generate, in our example about 8.3 Amp. This is a relatively low current, resulting in low copper losses (lower than in prior art solar arrays). A large electric current only flows in the large (+) and (−) input pads 920 and 930 of power converter 250. The current reaching pads 920 and 930, is the sum of the currents generated by all the strings of serial-units 220. In this example, the total sum current may be about 125 Amp.

In solar-array module 1000, each string of serial-units 220 is separately electrically-connected to the large (+) and (−) input pads 920 and 930 of the power converter 250. The ohmic losses will be about 2.3 Watt or 0.92% of the total output power 250 Watt. Such reduced losses are achieved with an innovative wiring schemes uses separate wires 1010, thus reducing ohmic losses in the wiring. The wiring scheme presented in the example solar-array module 1000, results in a substantial reduction in Ohmic losses, compared with prior art wiring, having the same type of wires:

In a conventional wiring scheme: Ohmic losses=21.25%.
In the present novel wiring scheme: Ohmic losses=0.92%.

Hence, the present novel wiring scheme significantly reduces ohmic losses, while allowing utilizing relatively thin wires—1 mm thickness and 10 mm width, for example.

The present invention being thus described in terms of several embodiments and examples, it will be appreciated that the same may be varied in many ways. Such variations are not to be regarded as a departure from the spirit and scope of the invention, and all such modifications as would be obvious to one skilled in the art are contemplated.

What is claimed is:

1. A solar power generation system for providing operating power for a desired application, the desired application having a predetermined operating power level requirement and predetermined operating voltage level requirement, the system comprising one or more solar-array modules, wherein each of said one or more solar-array modules includes:
   a. a multiplicity of solar cells,
      wherein a preconfigured number of said solar cells are electrically connected in series to form a serial unit, and wherein a preconfigured number of said serial units are electrically connected in series to form a string of serial-units, said string of serial-units is facilitated to produce a first output voltage level;
      wherein a preconfigured number of said strings of serial-units are electrically connected in parallel to form an array of said solar cells, said array of said solar cells is facilitated to produce a first output power level;
      wherein in each of said strings of serial-units, at least one serial-unit is also electrically connected in parallel to its neighboring serial-units, to form a crisscross matrix array of serial units; and
      wherein said crisscross matrix array of serial units allows currents to bypass malfunctioning serial units; wherein the electrical connections within said crisscross matrix do not comprise switches; and
   b. a DC to DC power converter electrically connected to said crisscross matrix array of serial units, said power converter configured to boost said first output voltage level to a second output voltage level higher than said first output voltage level,
      wherein said power converter is configured in a push-pull configuration and comprises a plurality of transistors for alternately connecting the opposite sides in a primary of a transformer to a DC source, and wherein said converter is configured such that the operational duty cycle of said transistors is constant and a dead time between the switching time On to Off or Off to On of said transistors is less than 8% of the On or Off time periods.

2. The system of claim 1, wherein in each of said strings of serial-units, each serial unit is also electrically connected in parallel to the neighboring serial units of all other strings of serial-units, to form said crisscross matrix array of solar cells.

3. The system of claim 1, wherein said converter is configured such that said second output voltage level is sufficient to meet the desired application operating voltage level requirement.

4. The system of claim 1, wherein each of said strings of serial-units consists of the same number of said solar cells electrically connected in series.

5. The system of claim 1, wherein said power converter comprises MOSFET transistors.

6. The system of claim 1, wherein a preconfigured number of solar-array modules are electrically connected in series to form a string of solar-array modules, wherein said array of solar-array modules produces a third output voltage level.

7. The system of claim 6, wherein said array of solar-array modules is configured such that said third output voltage level is sufficient to meet the desired application operating voltage level requirement.

8. The system of claim 6, wherein a preconfigured number of said strings of solar-array modules are electrically connected in parallel, to form an array of solar-array modules, wherein said array of solar-array modules produces a third output power level.

9. The system of claim 8, wherein said array of solar-array modules is configured such that said third output power level is sufficient to meet the desired application operating power level requirement.

10. The system of claim 1, wherein said power converter comprises:
   a. a planar transformer including:
      i. a ferromagnetic core, wherein two window openings are formed at the opposing ends of said ferromagnetic core;
      ii. a primary coil;
      iii. a secondary coil;
      iv. input coil leads; and
      v. output coil leads;
   b. an input printed circuit, wherein receiving holes are formed in said printed circuit board, facilitating direct electrical connection to said input coil leads: and
   c. an output printed circuit, wherein receiving holes are formed in said output printed circuit, facilitating direct electrical connection to said output coil leads, wherein said input printed circuit and said output printed circuit are respectively disposed at said window openings of said ferromagnetic core, to thereby minimize the wiring length from said primary coil and said secondary coil to said input printed circuit and said output printed circuit, respectively.

11. The system of claim 1, wherein each of said solar-array modules further comprises a secondary, low power array of solar cells, used to start up said DC to DC power converter.

12. The system of claim 1, wherein said power converter includes a plus conductive pad and a minus conductive pad, and wherein at least one of said strings of serial units is individually wired to said plus conductive pad and said minus conductive pad.

13. The system of claim 1, with the further proviso that said DC to DC power converter lacks an output coil.

14. The system of claim 13, with the further proviso that at least one of an input capacitor or an output capacitor of said DC to DC power converter is not present.

15. The system of claim 13, with the further proviso that both of an input capacitor and an output capacitor of said DC to DC power converter are present.

16. The system of claim 1, with the further proviso that said DC to DC power converter comprises an output coil.

17. A solar power generation system for providing operating power for a desired application, the desired application having a predetermined operating power level requirement and predetermined operating voltage level requirement, the system comprising one or more solar-array modules, wherein each of said one or more solar-array modules includes:

a. a multiplicity of solar cells,
wherein a preconfigured number of said solar cells are electrically connected in series to form a serial unit, and wherein a preconfigured number of said serial units are electrically connected in series to form a string of serial-units, said string of serial-units is facilitated to produce a first output voltage level;
wherein a preconfigured number of said strings of serial-units are electrically connected in parallel to form an array of said solar cells, said array of said solar cells is facilitated to produce a first output power level;
wherein in each of said strings of serial-units, at least one serial-unit is also electrically connected in parallel to its neighboring serial-units, to form a crisscross matrix array of serial units; and
wherein said crisscross matrix array of serial units allows currents to bypass malfunctioning serial units; and b. a DC to DC power converter electrically connected to said crisscross matrix array of serial units, said power converter configured to boost said first output voltage level to a second output voltage level higher than said first output voltage level,
wherein said power converter comprises a plurality of transistors for alternately connecting the opposite sides in a primary of a transformer to a DC source, and wherein said converter is configured such that the operational duty cycle of said transistors is constant and a dead time between the switching time On to Off or Off to On of said transistors is less than 8% of the On or Off time periods; wherein said power converter includes a plus conductive pad and a minus conductive pad, and wherein at least one of said strings of serial units is individually wired to said plus conductive pad and said minus conductive pad.

18. The system of claim 17, wherein in each of said strings of serial-units, each serial unit is also electrically connected in parallel to the neighboring serial units of all other strings of serial-units, to form said crisscross matrix array of solar cells.

19. The system of claim 18, wherein a preconfigured number of solar-array modules are electrically connected in series to form a string of solar-array modules, wherein said array of solar-array modules produces a third output voltage level.

20. The system of claim 19, wherein said array of solar-array modules is configured such that said third output voltage level is sufficient to meet the desired application operating voltage level requirement.

21. The system of claim 20, wherein a preconfigured number of said strings of solar-array modules are electrically connected in parallel, to form an array of solar-array modules, wherein said array of solar-array modules produces a third output power level.

22. The system of claim 21, wherein said array of solar-array modules is configured such that said third output power level is sufficient to meet the desired application operating power level requirement.

* * * * *